(12) United States Patent
Wang et al.

(10) Patent No.: US 6,200,885 B1
(45) Date of Patent: Mar. 13, 2001

(54) III-V SEMICONDUCTOR STRUCTURE AND ITS PRODUCING METHOD

(75) Inventors: Hung-Tsung Wang, Taipei; Ming-Jyh Hwu, Taoyuan; Yao-Hwa Wu, Taipei; Liann-Be Chang, Taoyung, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/246,334

(22) Filed: Feb. 9, 1999

(30) Foreign Application Priority Data

Apr. 27, 1998 (TW) .................................................. 87106467

(51) Int. Cl.$^7$ ..................................................... H01L 21/28
(52) U.S. Cl. ............................................. 438/572; 438/573
(58) Field of Search ..................................... 438/167, 570, 438/572, 573, 574, 575, 745, 767; 257/280, 472, 473

(56) References Cited

U.S. PATENT DOCUMENTS

| 4,211,587 | * | 7/1980 | Massies et al. | 438/167 |
| 5,221,638 | * | 6/1993 | Ohtsuka et al. | 438/573 |
| 5,627,090 | * | 5/1997 | Marukawa et al. | 438/572 |

* cited by examiner

*Primary Examiner*—Charles Bowers
*Assistant Examiner*—Keith Christianson
(74) *Attorney, Agent, or Firm*—Tilton, Fallon, Lungmus & Chestnut

(57) ABSTRACT

A III-V semiconductor structure and it producing method is provided. The method for forming a III-V semiconductor structure having a Schottky barrier layer includes the steps of (a) providing a III-V substrate, (b) treating the first barrier layer with a sulfuric acid solution, (c) forming a Schottky barrier layer on the III-V substrate, and (d) forming a metal layer on the second barrier layer. The Ill-V semiconductor structure includes a III-V substrate, a Schottky barrier layer, and a metal layer. The Schottky barrier layer is made of $Al_2(SO_4)_3$ and $In_2(SO_4)_3$.

12 Claims, 6 Drawing Sheets

III-V SEMICONDUCTOR STRUCTURE AND ITS PRODUCING METHOD

FIELD OF THE INVENTION

The present invention relates to a III-V semiconductor structure and its producing method.

BACKGROUND OF THE INVENTION

The metal/semiconductor Schottky junction of a III-V Schottky diode has the characteristics of a monocarrier and a fast switching speed, and can be used in the fields of photoelectric and microwave applications. However, the surface conditions of the III-V Schottky diode, such as the impurity content and surface free radicals, will influence its barrier hight. The energy barrier of a Schottky diode is called the Schottky barrier. If the surface defects of the diode can be minimized, the Schottky barrier height will be increased and the diode will be more useful. Please refer to FIG. 1 showing a conventional structure of a Schottky diode. The diode includes a metal layer 1, a Schottky barrier layer 2, and a substrate 3. The metal layer 1 is usually made of a noble metal for conducting the electricity. The Schottky barrier layer 2 is a thin aluminum layer sputtered on the substrate 3. Conventionally, it has been found that the Schottky barrier height can effectively increase after treating the substrate with a solution containing sulfur ions. However, the sulfur ion in the surface of the substrate will evanesce off after using it for a period of time or after working under a high temperature. Then, the Schottky barrier height will be lowered again. Another method disclosed that the Schottky barrier can also be increased after treating the substrate with aluminum fluoride solution ($AlF_3$), but the ideality factor of this method is too high to be applied in the industry. (see J. Applied Physics, Vol. 78, p. 291 (1995))

Accordingly, the present invention provides an easy and economical method for producing a III-V Schottky diode and provides a new diode structure. This method quite useful for every kind of III-V semiconductor structure.

SUMMARY OF THE INVENTION

An object of the present invention is to provide a III-V semiconductor structure having a Schottky barrier. The structure includes a Ill-V substrate, a Schottky barrier layer formed on the III-V substrate by reacting the III-V substrate with sulfate ions, and a metal layer formed on the Schottky barrier layer.

Preferably, the III-V substrate is made of one selected from a group consisting of InP, GaAs, InGaAs, InGaP, InGaAsP, InAs, and InSb, and the metal layer is made of one selected from a group consisting of Au, Ag, Ni, Pt, and Pd.

In an embodiment of the present invention, the Schottky barrier layer is a single layer made of $Al_2(SO_4)_3$ and $In_2(SO_4)_3$. In another embodiment of the present invention, the Schottky barrier layer includes two layers, a first barrier layer made of AlInP on the Ill-V substrate and a second barrier layer made of $Al_2(SO_4)_3$ on the first barrier layer.

Another object of the present invention is to provide a method for forming a Ill-V semiconductor structure having a Schottky barrier layer.

The method includes (a) providing a III-V substrate, (b) treating the Ill-V substrate with a sulfuric acid solution, (c) forming a Schottky barrier layer on the III-V substrate, and (d) forming a metal layer on the Schottky barrier layer.

In accordance with the present invention, the sulfuric acid solution has a concentration ranged from 50 to 75 vol. %.

The Schottky barrier layer is formed by coating an aluminum layer having a thickness ranged from 30 to 70 Å on the treated III-V substrate, and the aluminum layer is coated by a method selected from a group consisting of evaporation, sputtering, deposition, plating, and electroplating. After the step (b), the method further includes a step of drying the III-V substrate by a nitrogen gas.

A further object of the present invention is to provide a method for forming a III-V semiconductor structure having a Schottky barrier layer.

The method includes (a) providing a Ill-V substrate, (b) forming a first barrier layer on the Ill-V substrate, (c) treating the first barrier layer with a sulfuric acid solution, (d) forming a second barrier layer on the first barrier layer, and (e) forming a metal layer on the second barrier layer.

Preferably, the first barrier layer is an AlInP layer formed by coating an aluminum layer on the III-V substrate, and the second barrier layer is an $Al_2(SO_4)_3$ layer formed by coating another aluminum layer on the treated first barrier layer. Before the step (b), the method further includes a step of cleaning the III-V substrate. After the step (c), the method further includes a step of drying the second barrier layer by a nitrogen gas.

The present invention may best be understood through the following description with reference to the accompanying drawings, in which:

DETAILED DESCRIPTION OF THE PREFERRED EMBODIMENTS

Figure 1:
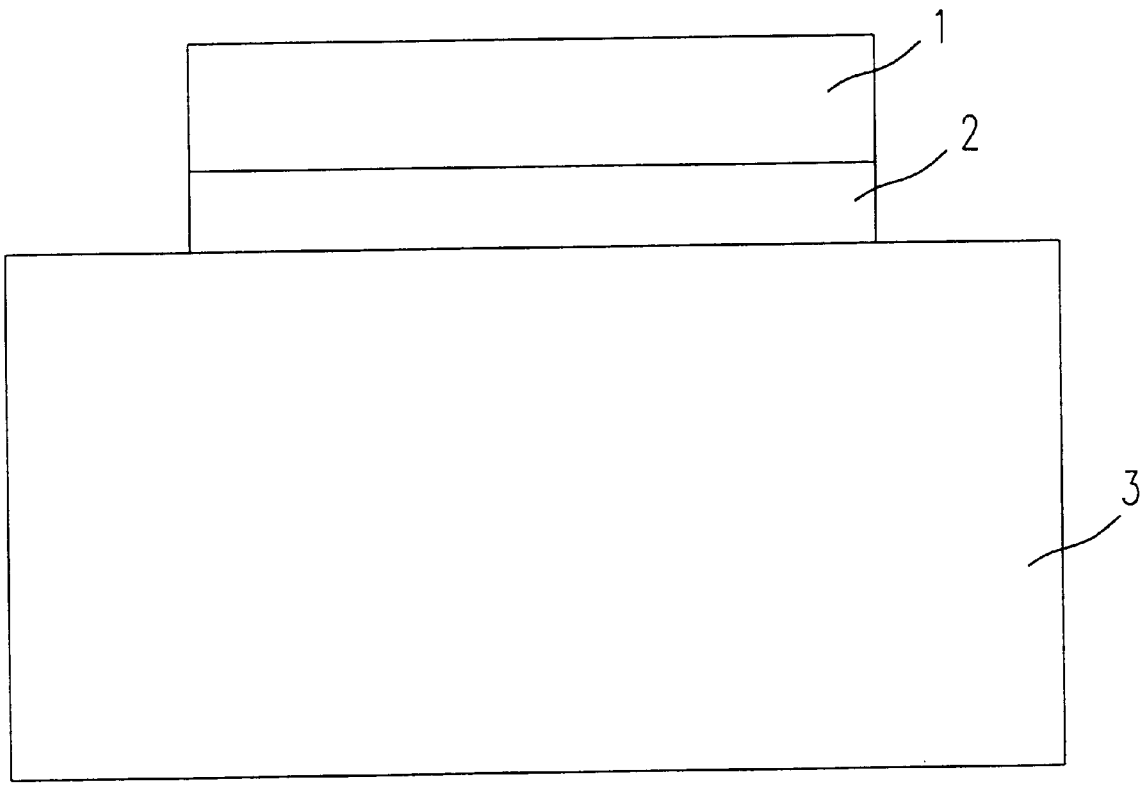
FIG. 1 is a schematic diagram showing a cross-sectional view of a conventional Schottky diode.
Figure 2:
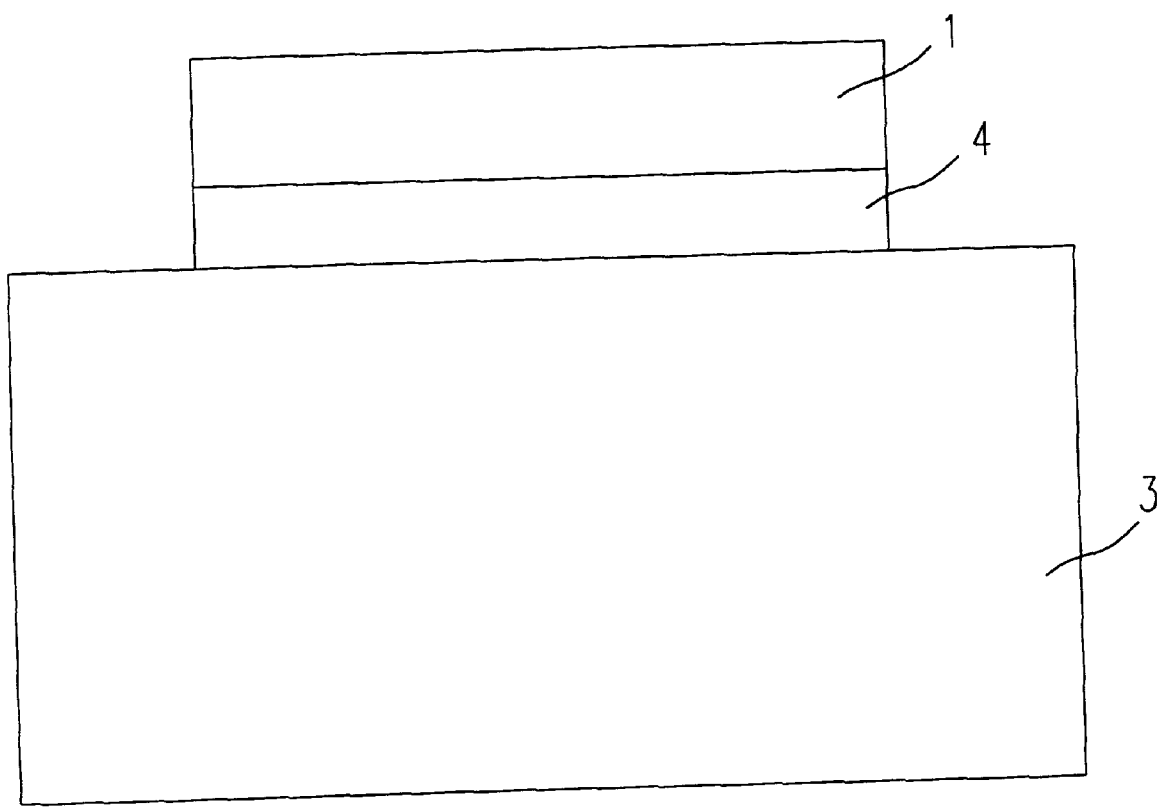
FIG. 2 is a schematic diagram showing a cross-sectional view of a Schottky diode according to the present invention, wherein the Schottky barrier layer is a single layer.

Please refer to FIG. 2 showing a preferred embodiment of the structure of a Schottky diode according to the present invention. The Schottky diode includes a metal layer 1, a Schottky barrier layer 4, and a substrate 3. The III-V substrate 3 is usually a N-type substrate. The III-V substrate 3 is made of InP, but it can also be other III-V compounds, such as GaAs, InGaAs, InGaP, InGaAsP, InAs, and InSb. The metal layer 1 is made of Au for conducting the electricity, but it can also be other noble metals, such as Ag, Ni, Pt, and Pd. The Schottky barrier layer 2 is a thin aluminum layer sputtered on the substrate 3. The Schottky barrier layer 4 is made of $Al_2(SO_4)_3$ and $In_2(SO_4)_3$, but the conventional Schottky barrier layer is merely a aluminum layer.

The method for forming this Schottky diode includes (a) providing a III-V substrate, (b) treating the Ill-V substrate with a sulfuric acid solution, (c) forming a Schottky barrier layer on the III-V substrate, and (d) forming a metal layer on the Schottky barrier layer. The sulfuric acid solution has a concentration ranged from 50 to 75 vol. %. After treating the InP substrate with the sulfuric acid solution, the surface of the InP substrate is partially etched and there are many sulfuric ions retaining thereon. Then, a Schottky barrier layer is formed by coating an aluminum layer on the treated InP substrate. The thickness of the coated aluminum layer is usually ranged from 30 to 70 Å, preferably 70 Å. The method of coating aluminum layer can be evaporation, sputtering, deposition, plating, or electroplating. Thereafter, the coated aluminum ions will react with the InP substrate to form the Schottky barrier layer made of $Al_2(SO_4)_3$ and $In_2(SO_4)_3$. Finally, after the Au metal layer is formed on the Schottky barrier layer, an Au/Al/InP Schottky diode according to the present invention is formed.

Figure 3:
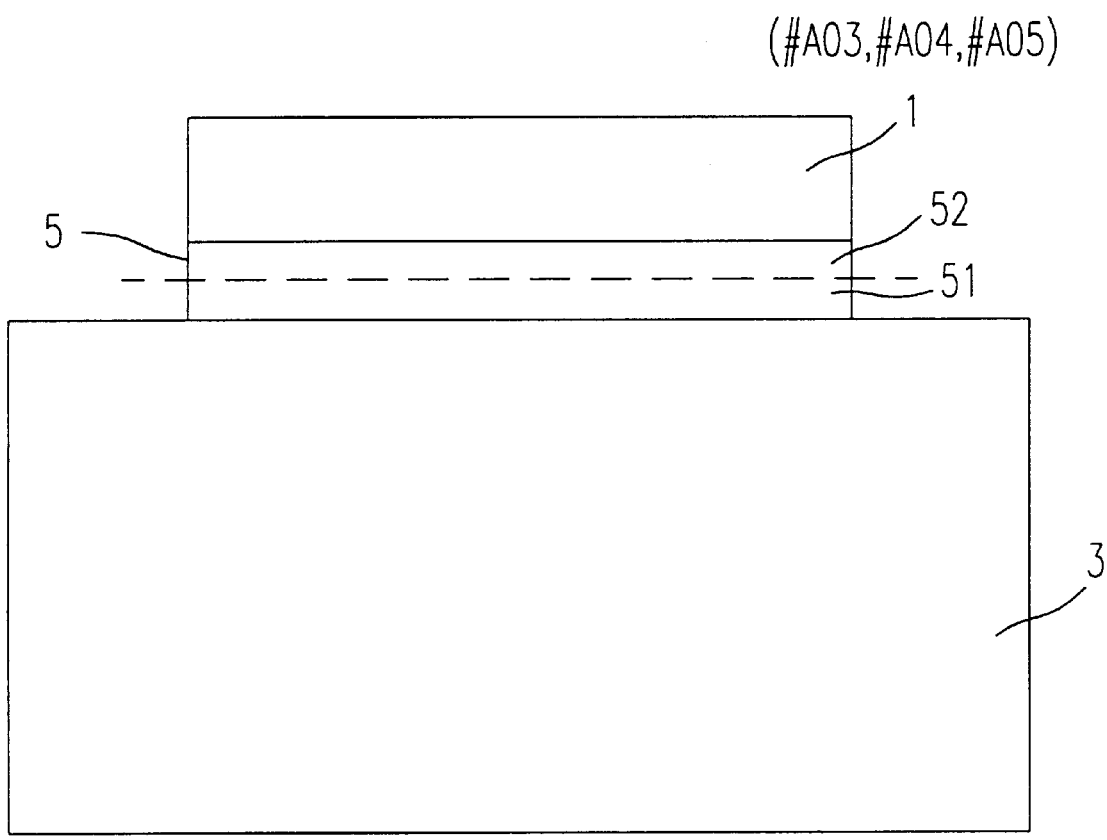
FIG. 3 is a schematic diagram showing a cross-sectional view of a Schottky diode according to the present invention, wherein the Schottky barrier layer is a double layer.

Please refer to FIG. 3 showing another preferred embodiment of the structure of a Schottky diode according to the present invention. The Schottky diode includes a metal layer 1, a Schottky barrier layer 5, and a substrate 3. The Schottky barrier layer 5 further includes a first barrier layer 51 and a second barrier layer 52. The method for forming this Schottky diode includes (a) providing a III-V substrate, (b) forming a first barrier layer on the III-V substrate, (c) treating the first barrier layer with a sulfuric acid solution, (d) forming a second barrier layer on the first barrier layer, and (e) forming a metal layer on the second barrier layer. In the preferred embodiment of the present invention, the first barrier layer is an AlInP layer formed by coating an aluminum layer on the InP substrate. The thickness of the first barrier layer is about 35 Å. Then, the first barrier layer is treated with the sulfuric acid solution. Thereafter, the second barrier layer is formed by coating another aluminum layer on the first barrier layer. The thickness of the second barrier layer is about 35 Å. Because the surface of the first barrier layer is partially etched and there are many sulfuric ions retaining thereon, the aluminum ions will react with the InP substrate to form the second barrier layer made of $Al_2(SO_4)_3$. After the Au layer is formed on the second barrier layer, an Au/$Al_2(SO_4)_3$/AlInP/InP Schottky diode according to the present invention is formed. The Schottky diode with this sandwich-type structure is called the reinforced Schottky diode.

In order to compare the properties of the Schottky diode and the reinforced Schottky diode according to the present invention with the conventional Schottky diode, five samples are made by different methods. Sample A01 is formed by the following steps: (a) preparing an InP substrate and a sulfuric acid solution ($H_2SO_4$: $H_2O$=1.5:1) which is cooled to 4° C., (b) immersing the InP substrate into the sulfuric acid solution for a few seconds and drying the InP substrate by a nitrogen gas, (c) depositing an aluminum layer (about 70 Å) on the InP substrate in a deposition room (under the vacuum of less than $1\times10^{-6}$), and (d) sputtering an Au layer on the aluminum layer to form the Schottky diode according to the present invention. Sample A02 is formed by the steps similar to those for Sample 1 but without the step (b). Sample A02 is a conventional Schottky diode.

Samples A03~A05 are formed by the following steps: (a) preparing three InP substrates and sulfuric acid solutions ($H_2SO_4$: $H_2O$=1:1, 1.5:1, 2:1) which is cooled to 4° C., (b) depositing 35 Å aluminum layers on the InP substrates in a deposition room (under the vacuum of less than $1\times10^{-6}$) to form the first barrier layers, (c) immersing the first barrier layers into the sulfuric acid solution (Sample A03 (1:1), Sample A04 (1.5:1), Sample A05 (2:1)) for a few seconds, and drying the InP substrate by a nitrogen gas, (d) depositing another 35 Å aluminum layers on the first barrier layers in a deposition room (under the vacuum of less than $1\times10^{-6}$) to form the second barrier layers, and (e) sputtering Au layers on the second barrier layers to form the reinforced Schottky diodes of the present invention.

Figure 4:
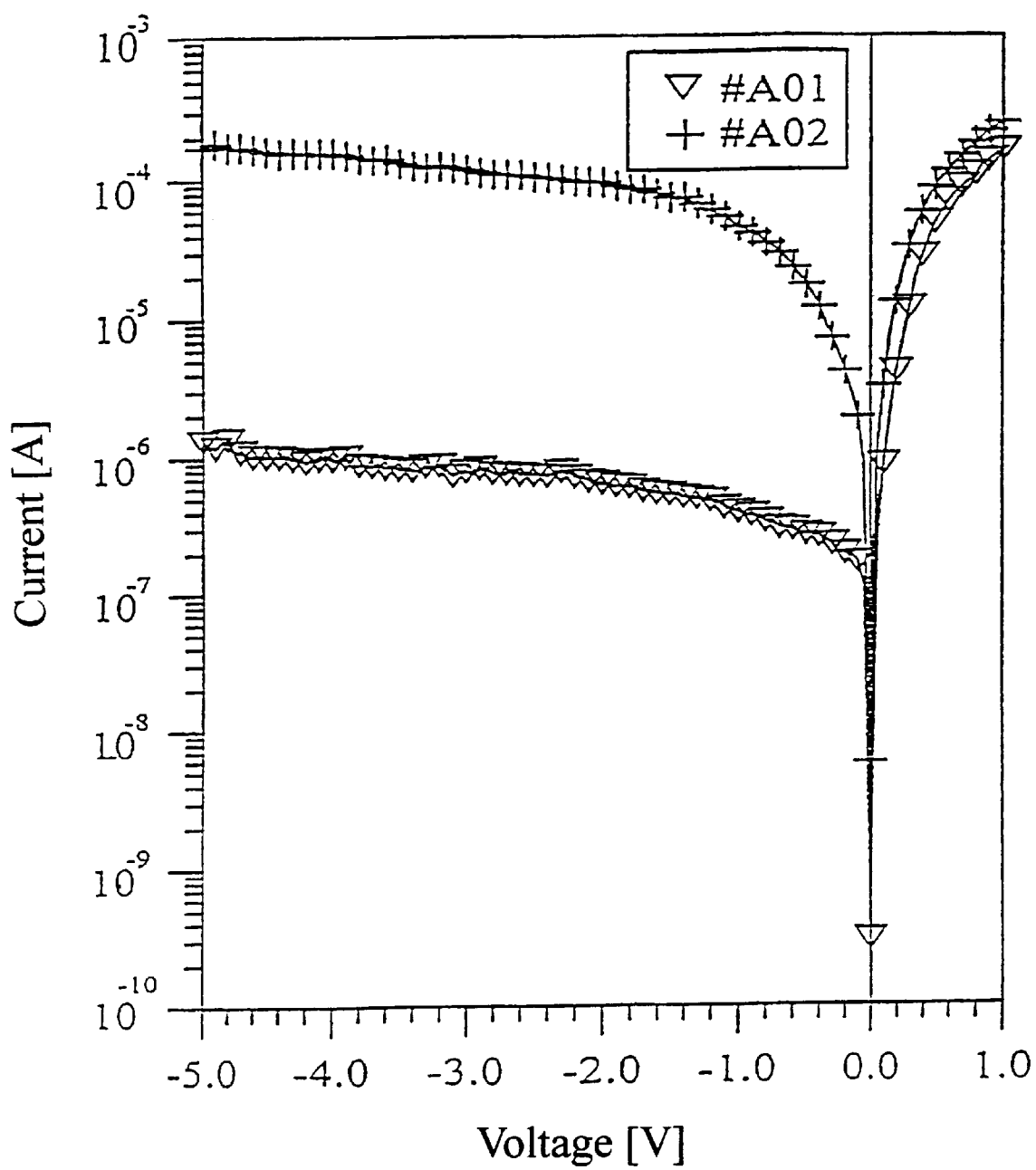
FIG. 4 is a current vs. voltage graph for Samples A01 and A02.

FIG. 4 is a graph showing the relation of current and voltage for Sample A01 and Sample A02 after curing at 250° C. for 4 hours. The Schottky barriers of Samples A01 and A02 are 0.55 eV and 0.51 eV respectively, and the ideality factors are 1.06 and 1.02 respectively. The Schottky diode of the present invention, Sample A01, has a higher Schottky barrier than the conventional Schottky barrier, Sample A02.

Figure 5:
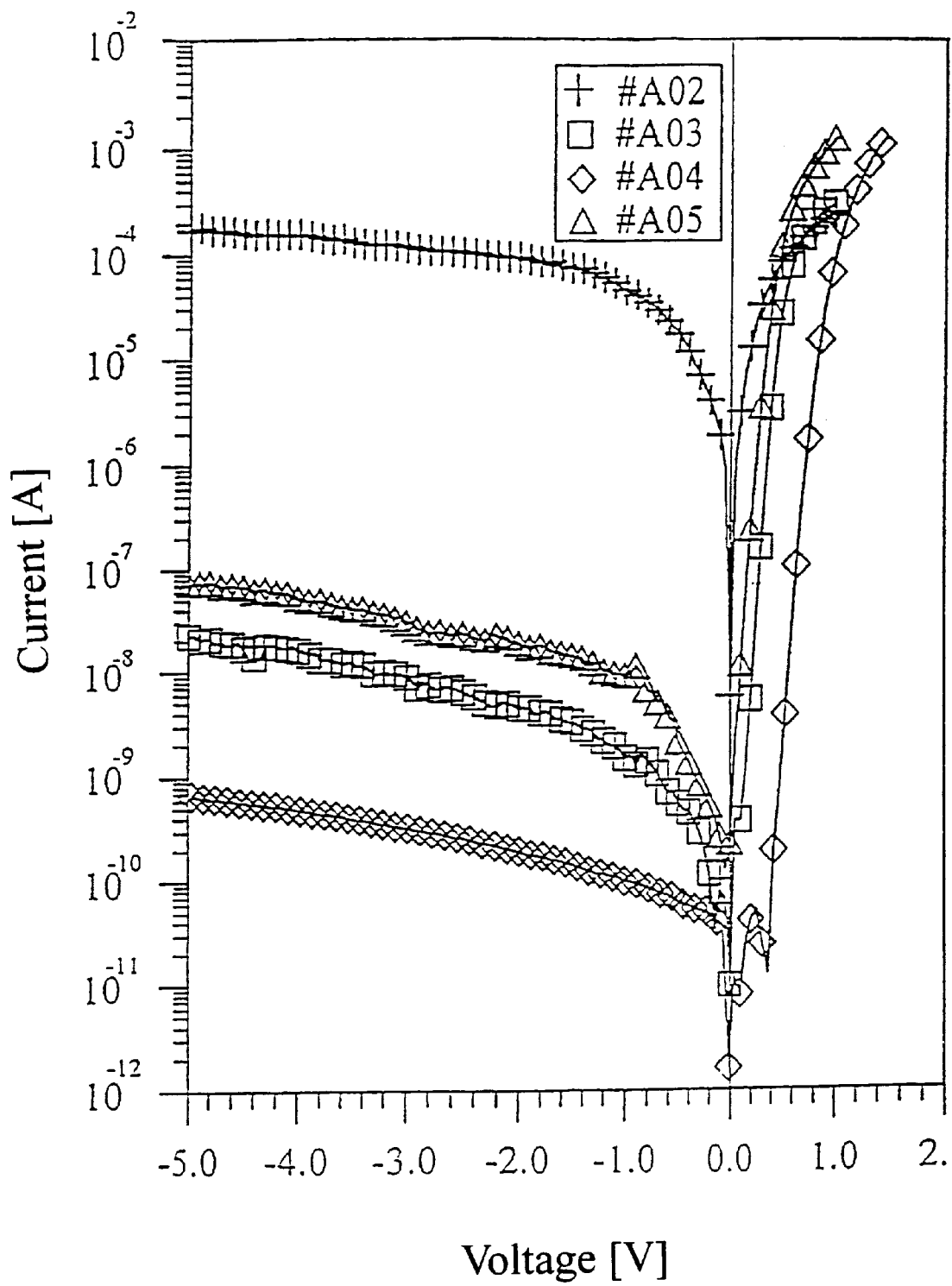
FIG. 5 is a current vs. voltage graph for Samples A02, A03, A04, and A05.

FIG. 5 is a graph showing the relation of current and voltage for Samples A02, A03, A04, and A05 after curing at 250° C. for 4 hours. The Schottky barriers of Samples A03, A04, and A05 are 0.84 eV, 1.07 eV, and 0.78 eV respectively, and the ideality factors are 1.09, 1.12, and 1.14 respectively. The reinforced Schottky diodes of the present, Samples A03~A05, have a further higher Schottky barrier than the conventional Schottky barrier, Sample A02.

Figure 6:
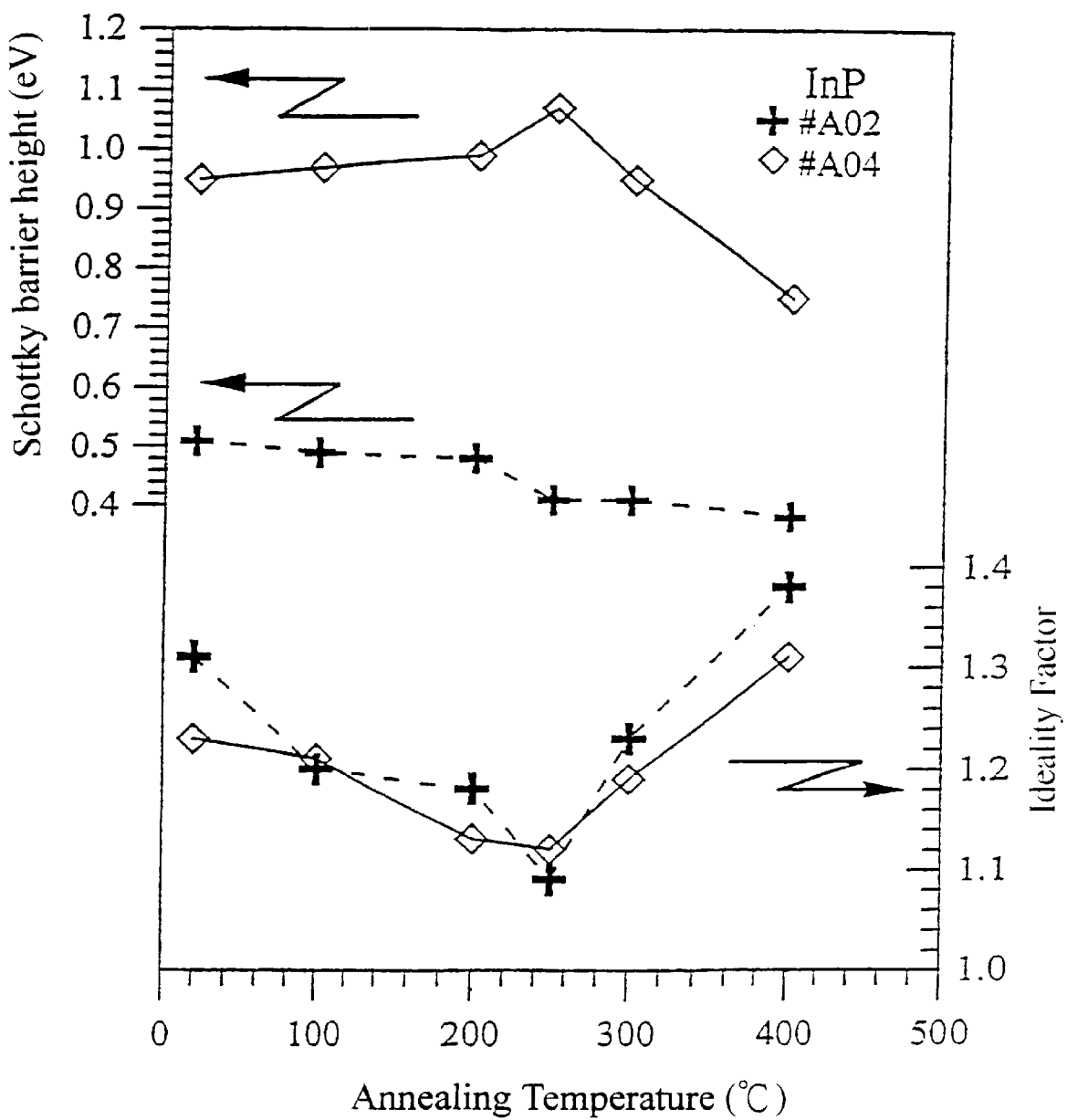
FIG. 6 is a Schottky barrier height and ideality factor vs. annealing temperature graph for Samples A02 and A04.

FIG. 6 is a graph showing relation of the Schottky barrier heights and ideality factors at various annealing temperatures for Samples A02 and A04. In this graph, the ideality factor of the conventional Schottky diode, Sample A02, is more unstable than that of the reinforced Schottky diode, Sample A04.

To sum up, the Schottky diodes according to the present invention have a higher Schottky barrier than the conventional one. Because the crystal structure of the $Al_2(SO_4)_3$ and $In_2(SO_4)_3$ layer is more stable than Al, the energy barrier of the $Al_2(SO_4)_3$ and $In_2(SO_4)_3$ layer is higher than Al. In addition, in one specific embodiment, the Schottky barrier of the reinforced Schottky diode having two layers (AlInP layer and $Al_2(SO_4)_3$ layer) is more stable and higher than that of the one-layer structure. Therefore, the reinforced Schottky diode has the highest Schottky barrier.

According to the present invention, the sulfuric acid solution not only removes the impurities on the surface but also helps to form the Schottky barrier layer with a more stable crystal structure. The process of the present invention is easy and economic. Certainly, the present invention can be applied to other kinds of III-V substrate such as GaAs, InGaAs, InGaP, InGaAsP, InAs, and InSb.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a semiconductor structure having a Schottky barrier layer comprising the steps of:

(a) providing a substrate made from one selected from a group consisting of InP, GaAs, InGaP, InGaAsP, InAs and InSb;

(b) treating said substrate with a sulfuric acid solution;

(c) coating an aluminum layer on said treated substrate to form a Schottky barrier layer on said substrate; and (d) forming a metal layer on said Schottky barrier layer.

2. The method according to claim 1, wherein said sulfuric acid solution has a concentration ranged from 50 to 75 vol. %.

3. The method according to claim 1, wherein said aluminum layer is coated by a method selected from a group consisting of evaporation, sputtering, deposition, plating, and electroplating.

4. The method according to claim 1, wherein said Schottky barrier layer is made of $Al_2(SO_4)_3$ and $In_2(SO_4)_3$.

5. The method according to claim 1, wherein said Schottky barrier layer has a thickness ranged from 30 to 70 Å.

6. The method according to claim 1, wherein said metal layer is made of one selected from a group consisting of Au, Ag, Ni, Pt, and Pd.

7. The method according to claim 1, wherein after the step (b), said method further comprises a step of drying said substrate by a nitrogen gas.

8. A method for forming a semiconductor structure having a Schottky barrier layer comprising the steps of:

(a) providing a substrate made of one selected from a group consisting of InP, GaAs, InGaAs, InGaP, InGaAsP, InAs and InSb;

(b) coating an aluminum layer on said substrate to form a first barrier layer on said substrate;

(c) treating said first barrier layer with a sulfuric acid solution;

(d) coating another aluminum layer on said treated first barrier layer to form a second barrier layer on said first barrier layer; and (e) forming a metal layer on said second barrier layer.

9. The method according to claim 8, wherein said first barrier layer is an AlInP layer.

10. The method according to claim 8, wherein said second barrier layer is an $Al_2(SO_4)_3$ layer.

11. The method according to claim 8, wherein before said step (b), said method further comprises a step of cleaning said substrate.

12. The method according to claim 8, wherein after said step (c), said method further comprises a step of drying said second barrier layer by a nitrogen gas.

* * * * *